United States Patent [19]
Lang et al.

[11] Patent Number: 5,694,020
[45] Date of Patent: *Dec. 2, 1997

[54] APPARATUS FOR CONTROLLING BATTERY DISCHARGE

[75] Inventors: Gerhard Lang, Altweilnau; Jürgen Wolf, Kriftel, both of Germany

[73] Assignee: Braun Aktiengesellschaft, Kronberg, Germany

[*] Notice: The term of this patent shall not extend beyond the expiration date of Pat. No. 5,623,193.

[21] Appl. No.: 592,113

[22] Filed: Jan. 26, 1996

Related U.S. Application Data

[63] Continuation of Ser. No. 211,011, filed as PCT/DE92/00639 Jul. 30, 1992.

[30] Foreign Application Priority Data

Sep. 26, 1991 [DE] Germany .................. 41 31 981.8

[51] Int. Cl.⁶ .................................................. H01M 10/46
[52] U.S. Cl. ........................................ 320/13; 320/31
[58] Field of Search .......................... 320/13, 31, 39, 320/48

[56] References Cited

U.S. PATENT DOCUMENTS

| | | | |
|---|---|---|---|
| 4,342,953 | 8/1982 | Collins | 320/13 |
| 4,380,726 | 4/1983 | Sado et al. | 320/48 |
| 4,703,247 | 10/1987 | Morioka | 320/13 |
| 4,835,453 | 5/1989 | Munning Schmidt et al. | 320/13 |

FOREIGN PATENT DOCUMENTS 0 240 883  10/1987  European Pat. Off. .

OTHER PUBLICATIONS

Copy of European Search Report dated May 24, 1996.

*Primary Examiner*—Edward Tso
*Attorney, Agent, or Firm*—Fish & Richardson, P.C.

[57] ABSTRACT

The invention is directed to an electrical device in which an electrical load is powered by a battery via an electronic switching device. A display means serves the function of indicating the charge status of the battery, and a time measurement means determines the connection time of the load to the battery. Following expiration of a predetermined connection time of the load to the battery, when the display means indicates the charge status "zero", the time measurement means will disconnect the electrical load from the battery by means of the electronic switching device.

6 Claims, 3 Drawing Sheets

REDUCTION OF MOTOR ROTATIONAL FREQUENCY n AS A FUNCTION OF PULSE DUTY FACTOR r AT POINT (B)

APPARATUS FOR CONTROLLING BATTERY DISCHARGE

This is a continuation of copending application Ser. No. 08/211,011, filed as PCT/DE92/00639 Jul. 30, 1992.

This invention relates to an electrical device with a battery, an electrical load powered by the battery via an electronic switching device, and a display means for indicating the charge status of the battery.

Battery-powered electrical devices, in particular consumer goods such as rechargeable shavers, are increasingly equipped with displays indicating the actual charge status of the battery or accumulator. For cost reasons, such charge status indicators usually operate on a time basis because such devices have an essentially constant power consumption (constant power), and the rated capacity of the battery is known.

For reasons of capacity changes of the battery and/or fluctuations in the power consumption of the device, it may happen that the display provides an incorrect information on the actual charge status of the battery. This is an inconvenience particularly towards the end of a discharge cycle when the battery is nearly depleted.

It is therefore an object of the present invention to improve the accuracy of the charge status indication of a battery-operated electrical device towards the end of the discharge cycle and to protect the battery against deep discharges.

In a device of the type initially referred to using a time measurement means determining the connection time of the load to the battery, this object is accomplished in that the time measurement means disconnects the electrical load from the battery by means of the electronic switching device following expiration of a set connection time of the load to the battery, when the display means indicates the charge status "zero".

In a device of the type initially referred to using a voltage discriminator detecting a predetermined voltage on the battery, this object is accomplished in that the voltage discriminator activates a time measurement means on sensing the predetermined voltage on the battery, the time measurement means controlling the display means and disconnecting the electrical load from the battery by means of the electronic switching device following expiration of a predetermined time period, when the display means indicates the charge status "zero".

When the electrical load is a direct-current motor, an advantageous embodiment of the present invention consists in that the time measurement means, following expiration of the predetermined time period, drives a pulse-duration modulator reducing the pulse duty factor of the control voltage for the electronic switching device, so that the rotational frequency of the motor is reduced in steps or continually down to zero, thereby preventing the motor from stopping abruptly which would be awkward in an electric shaver or hair clipper, for example, because of the risk of hair being snagged.

Further advantageous embodiments will become apparent from the other subclaims and the description.

Embodiments of the present invention will now be described in more detail in the following with reference to the accompanying drawings.

Figure 1:
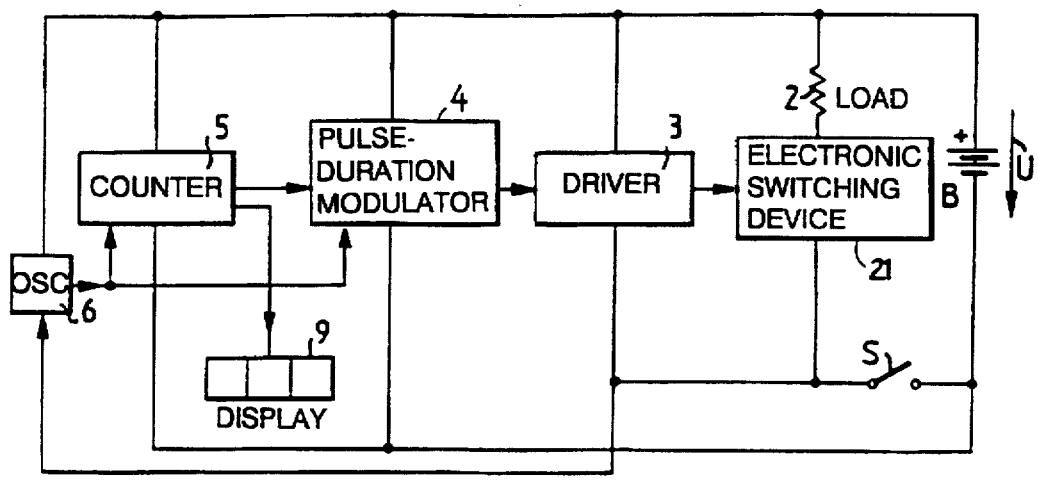
FIG. 1 is a block diagram.

Referring now to FIG. 1 of the drawings, a load 2 is connected to a battery (accumulator) B by means of an On/Off switch S and an electronic switching device 21. The battery B can be recharged by means of a charging circuit not shown. The electronic switching device 21 is driven by a pulse-duration modulator 4 via a driver circuit 3.

A counter 5 records the time period during which the load L, which has an essentially constant power consumption, is connected to the battery B via the switch S, the count starting from a fully charged condition of the battery.

The rated capacity of the battery B being also known, a display means 9 indicating the charge status of the battery is controlled by the counter 5 on a time basis. After a predetermined connection time has elapsed which is determined on the basis of the known power consumption and the known rated capacity of the battery B, such that the battery then contains a low residual charge only, the counter 5 will deliver an output signal. At this point, the display means 9 will indicate the charge status "zero". This signal will cause the electronic switching device 21 to be driven. Driving may be accomplished by a pulse-duration modulator 4 which gradually reduces the pulse duty factor of the control voltage down to zero, thus also gradually reducing the current flowing through the load 2. An oscillator 6 provides the clock pulses for the counter 5 and the pulse-duration modulator 4.

Figure 2:
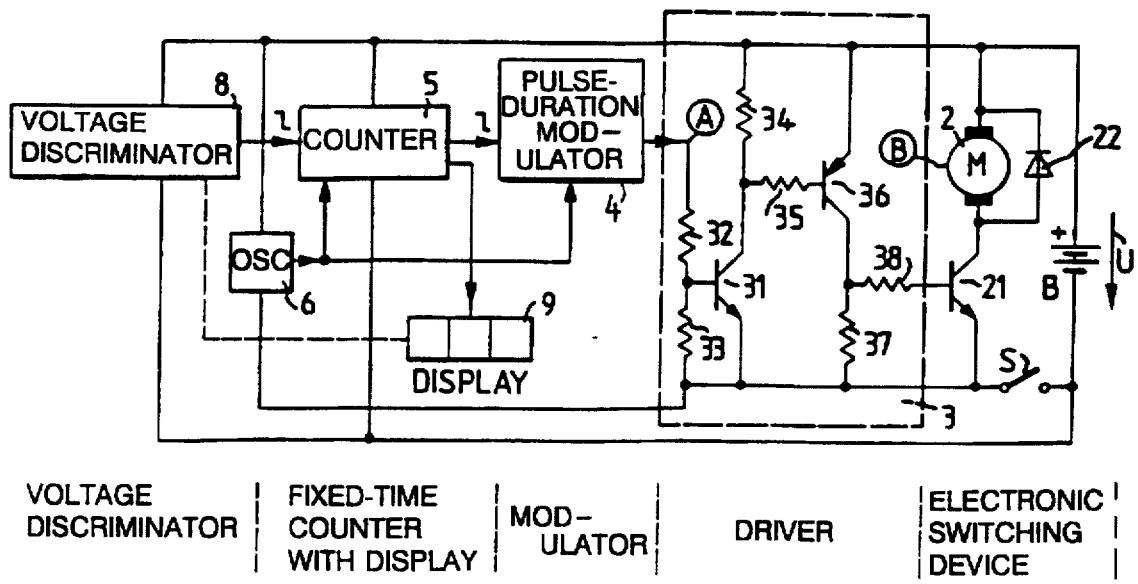
FIG. 2 is a block diagram showing an embodiment in which the electrical load is a motor.

In FIG. 2, the load 2 is a direct-current motor M of an electric shaving apparatus, for example. The series arrangement comprising the motor M and the switching transistor 21 is applied to the battery B via the On/Off switch S when the device is set in operation. A diode 22 connected in parallel with the motor M prevents inductive voltage peaks. The base of the switching transistor 21 is driven by the output of the pulse-duration modulator 4 via a driver circuit 3 comprised of transistors 31, 36 and resistors 32, 33, 34, 35, 37, 38.

Connected directly in parallel with the battery B, that is, bypassing the On/Off switch S, are a voltage discriminator 8 and the counter 5. The voltage discriminator 8 detects a predetermined voltage U on the battery B. This detected voltage U is, for example, the "low charge" level, that is, a voltage level U residing at the battery when the battery contains only 10% to 20% of its full charge. Until this low-charge level is reached, the display means 9 will indicate the charge status resulting from the preceding time period during which the motor M has been connected to the battery B.

When the voltage discriminator 8 has detected the low-charge level of the voltage U on the battery B, the counter 5 and a second indicating unit of the display means 9 will be started. When the detected low-charge level is attained, the motor has, for example, only eight minutes of operation left until the battery B is completely depleted. The time period predetermined for the counter 5 is then six minutes, for example, in order to preclude complete discharging of the battery. This period of six minutes may be subdivided into six fixed time intervals of equal length, so that each minute one segment of the second indicating unit of the display means 9 is driven. These segments may also indicate the minutes remaining until expiration of the predetermined time period. After the predetermined time (six minutes) has elapsed, that is, when the counter 5 has reached zero, the pulse-duration modulator 4 will be driven.

Figure 3:
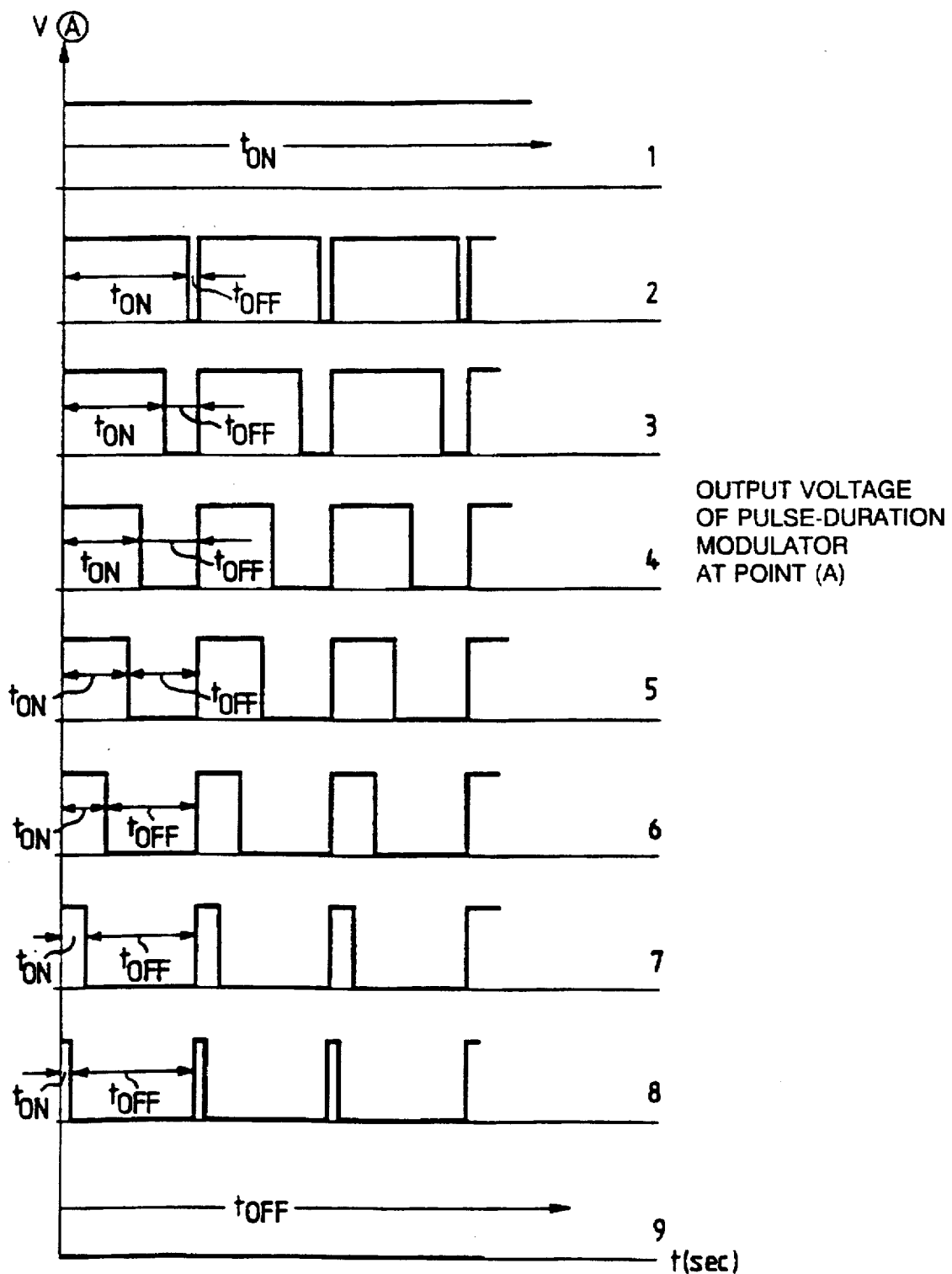
FIG. 3 is a graph showing an output signal of the pulse-duration modulator of FIG. 2, when the rotational frequency of the motor is reduced in conformity with a drop in battery voltage.
Figure 4:
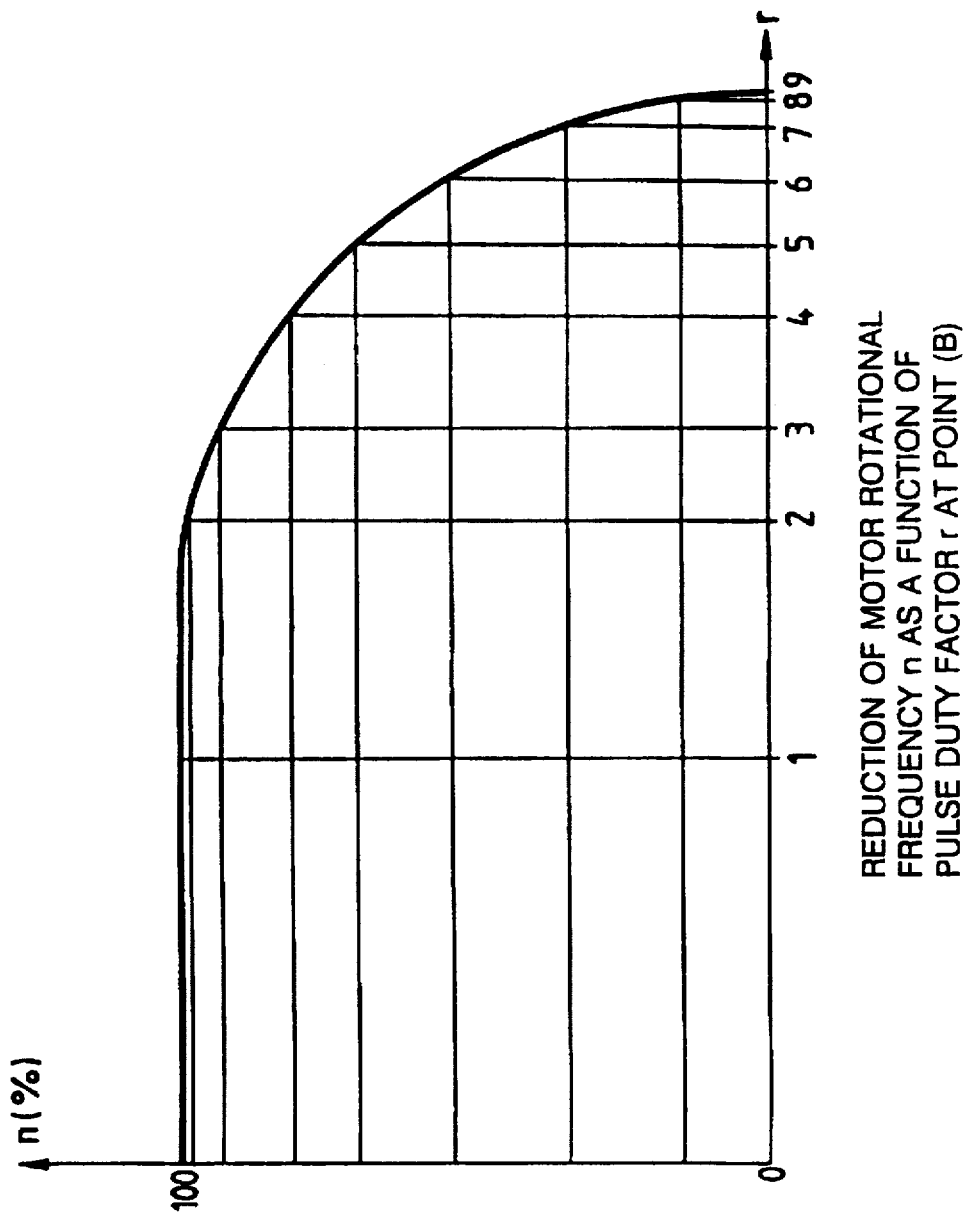
FIG. 4 is a graph showing the rotational frequency of the motor as a function of the pulse duty factor of the pulse-duration modulator of FIG. 3.

This pulse-duration modulator 4 then reduces the pulse duty factor of the control voltage supplied to the driver circuit 3 in a manner shown in FIG. 3 by way of example. The individual pulse duty factors of FIG. 3 are assigned numerals from 1 (full control voltage) through 9 (control voltage zero). FIG. 4 illustrates the rotational frequency (in % of the rated speed) plotted against these pulse duty factors, with the pulse duty factors assigned numerals 1 to 9 corresponding to those shown in FIG. 3. The curve corresponds essentially to the voltage curve of a battery with the load switched on until it is completely discharged.

In this manner, deep discharging of the battery is avoided. Because an abrupt standstill of the motor is prevented from occurring, hair cannot be painfully snagged in a shaver or hair clipper by accident.

We claim:

1. Battery powered electrical shaver or hair cutter comprising cutter apparatus, a motor for driving said cutter apparatus, said motor being adapted to be powered by a battery, and circuitry operative upon detection of a defined discharging condition of said battery for reducing power to said motor in multiple steps or continually so that its rotational frequency is reduced down to zero in steps or continually to limit risk that hairs can be snagged.

2. The electrical shaver of claim 1, wherein said circuitry reduces said rotational frequency of said motor linearly with time.

3. The electrical shaver of claim 1 wherein said circuitry reduces said rotational frequency of said motor similarly to a curve of a falling battery voltage shortly before complete depletion.

4. The electrical shaver of claim 1, wherein said circuitry includes an electronic switching device and a pulse duration modulator for reducing the pulse duty factor of the control voltage for said electronic switching device, so that the rotational frequency of said motor is reduced in steps or continually down to zero.

5. The electrical shaver of claim 4, wherein said circuitry reduces said rotational frequency of said motor linearly with time.

6. The electrical shaver of claim 4 wherein said circuitry reduces said rotational frequency of said motor similarly to the curve of a falling battery voltage shortly before complete depletion.

* * * * *